(12) United States Patent
Morrow et al.

(10) Patent No.: US 7,730,325 B2
(45) Date of Patent: Jun. 1, 2010

(54) VERIFICATION SYSTEM AND METHOD

(75) Inventors: James Morrow, Sparks, NV (US); Marvin Hein, Las Vegas, NV (US)

(73) Assignee: Bally Gaming, Inc., Las Vegas, NV (US)

( * ) Notice: Subject to any disclaimer, the term of this patent is extended or adjusted under 35 U.S.C. 154(b) by 1154 days.

(21) Appl. No.: 10/836,849

(22) Filed: Apr. 30, 2004

(65) Prior Publication Data

US 2005/0005155 A1 Jan. 6, 2005

Related U.S. Application Data

(63) Continuation-in-part of application No. 10/243,912, filed on Sep. 13, 2002.

(51) Int. Cl.
H04L 29/06 (2006.01)
H04L 9/32 (2006.01)

(52) U.S. Cl. .................. 713/191; 725/146; 713/164

(58) Field of Classification Search ......... 713/189–194, 713/164–167, 168; 463/29, 43; 725/146, 725/152–153, 168
See application file for complete search history.

(56) References Cited

U.S. PATENT DOCUMENTS

| | | | | |
|---|---|---|---|---|
| 5,599,231 A * | 2/1997 | Hibino et al. | ............... | 463/29 |
| 5,918,248 A | 6/1999 | Newell et al. | | |
| 6,149,522 A | 11/2000 | Alcorn et al. | | |
| 6,430,481 B1 | 8/2002 | Lovelace, II et al. | | |
| 6,430,738 B1 | 8/2002 | Gross et al. | | |
| 6,488,585 B1 | 12/2002 | Wells et al. | | |
| 6,565,443 B1 * | 5/2003 | Johnson et al. | ............... | 463/43 |
| 6,595,856 B1 | 7/2003 | Ginsburg et al. | | |
| 6,908,391 B2 | 6/2005 | Gatto et al. | | |
| 6,916,247 B2 | 7/2005 | Gatto et al. | | |
| 6,928,278 B2 * | 8/2005 | Shimomura | ............... | 455/411 |
| 6,945,870 B2 | 9/2005 | Gatto et al. | | |
| 7,162,036 B2 * | 1/2007 | Rowe | ............... | 380/251 |
| 7,218,739 B2 * | 5/2007 | Multerer et al. | ............... | 380/251 |
| 2002/0002080 A1 | 1/2002 | Stockdale | | |
| 2002/0042293 A1 * | 4/2002 | Ubale et al. | ............... | 463/9 |
| 2002/0116615 A1 | 8/2002 | Nguyen et al. | | |
| 2003/0100369 A1 | 5/2003 | Gatto et al. | | |

(Continued)

FOREIGN PATENT DOCUMENTS

WO 00/07099 2/2000

(Continued)

*Primary Examiner*—Gilberto Barron, Jr.
*Assistant Examiner*—Venkat Perungavoor
(74) *Attorney, Agent, or Firm*—Steptoe & Johnson LLP

(57) ABSTRACT

A verification system has an operational component registry 10 that includes an interface 20, a memory device 30, and a processor 40. Preferably, the interface 20 in the operational component registry 10 communicates the installed identification data 50 from the gaming units 60 to the operational component registry. The memory device 30 preferably stores registered identification data 70 for the gaming units 60. Preferably, the processor 40 in the operational component registry 10 then analyzes the registered identification data 70 and the installed identification data 50 from the gaming units 60, after which enablement of the gaming units is determined based upon the examination of the registered identification data and the installed identification data. An operational component registry 10 may also monitor changes, services, requirements, enablement, and productivity of the gaming units or components of the gaming units.

114 Claims, 6 Drawing Sheets

U.S. PATENT DOCUMENTS

| | | | |
|---|---|---|---|
| 2003/0236991 A1* | 12/2003 | Letsinger | 713/200 |
| 2004/0072617 A1* | 4/2004 | Takahashi et al. | 463/42 |
| 2004/0193726 A1 | 9/2004 | Gatto et al. | |
| 2004/0198496 A1 | 10/2004 | Gatto et al. | |
| 2004/0254013 A1 | 12/2004 | Quraishi et al. | |
| 2005/0054445 A1 | 3/2005 | Gatto et al. | |
| 2005/0172336 A1 | 8/2005 | Gatto et al. | |
| 2005/0209006 A1 | 9/2005 | Gatto et al. | |
| 2005/0209007 A1 | 9/2005 | Gatto et al. | |
| 2005/0221898 A1 | 10/2005 | Gatto et al. | |
| 2005/0223219 A1 | 10/2005 | Gatto et al. | |
| 2005/0233811 A1 | 10/2005 | Gatto et al. | |
| 2005/0282637 A1 | 12/2005 | Gatto et al. | |
| 2006/0100010 A1 | 5/2006 | Gatto et al. | |
| 2007/0149280 A1* | 6/2007 | LeMay et al. | 463/29 |

FOREIGN PATENT DOCUMENTS

WO    WO 2004004855 A1    1/2004

* cited by examiner

VERIFICATION SYSTEM AND METHOD

CROSS REFERENCE TO RELATED DOCUMENTS

This application is a continuation-in-part of U.S. patent application Ser. No. 10/243,912, filed, Sep. 13, 2002. U.S. patent application Ser. No. 10/243,912, is hereby incorporated herein by reference.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

This invention relates generally to a verification system, and more particularly, to a verification system utilizing an operational component registry that identifies hardware and software components installed on one or more gaming units, and examines the installed components and registered components. The results of the examination are used to determine whether the gaming units and/or individual components of the gaming units are enabled.

BACKGROUND OF THE INVENTION

There are a wide variety of software, hardware and other types of verification systems that attempt to monitor additions, deletions, changes, and updates, which are routinely performed on gaming machines. Typically, in the gaming field, verification of software or hardware installed on a gaming machine may occur by reviewing the contents of a read-only memory. To ensure that tampering, such as with software codes or hardware devices has not occurred, a simple review of the memory contents and visual inspection of hardware is conducted to verify the gaming application. Such a memory check is performed before start-up of the gaming machine or during game play after a win occurs and by a regulatory field agent's inspection.

This type of verification system is typically adequate only if the gaming application is stored in a read-only memory (e.g., the memory is difficult to alter and the standard software verification systems prevent unauthorized access), and if there is little danger that the hardware of the gaming machine will be compromised. For instance, in a casino with 24-hour surveillance, it is likely that any hardware tampering would quickly be noticed.

Today, it is becoming more common to connect multiple gaming machines and/or multiple gaming locations to provide many different gaming options. Moreover, there is a desire to operate these multiple gaming machines and/or casinos using a centralized system or network. Accordingly, when multiple gaming machines or multiple casinos are connected over a local area network or a wide area network, it is difficult to quickly and efficiently run the above-described software verifications or to engage in constant surveillance in each location to assure that no hardware tampering is occurring.

Additionally, gaming services are evolving to include virtual and networked platforms that permit use of gaming systems and services through non-dedicated, web-based, or remote access points. These virtual and networked games increase the difficulty of monitoring the use of unauthorized software and/or hardware in these remote locations.

Still further, the assortment of gaming options and services that are available on a gaming machine and/or a gaming network may vary over time. As the variety of gaming options and services that are available continues to increase, it becomes more difficult to accurately monitor and regulate the software and hardware that are used to implement the different games and gaming applications.

Additionally, the registry and tracking systems that are currently in place merely indicate whether or not a component is contained within a registry. Known registry systems do not use the registry to track the requirements for operation and to determine whether or not a gaming unit or a particular component may be enabled. Additionally, known registry systems do not track changes and servicing of the components, and thus, do not allow the registry to be automatically updated with new, authorized component information. Finally, the current systems do not track the productivity of the gaming units.

Accordingly, those skilled in the art have long recognized the need for enhanced verification of components and improved security measures that prevent enablement of gaming units and components or unauthorized installation changes. There is also a continuing need for a system that provides additional security from tampering by tracking the installations and changes to software or hardware on a gaming unit, thereby preventing unauthorized enablement of a gaming unit. Further, there is a continuing need for a system that is useful in monitoring and tracking gaming operations and services performed on a gaming machine or its components. The claimed invention clearly addresses these and other needs.

SUMMARY OF THE INVENTION

Briefly, and in general terms, the claimed invention resolves the above and other issues by providing a verification system and method for identifying all components installed on one or more gaming units, and verifying that these installed components (i.e., the components that are actually installed) correspond to the registered components (i.e., the components that are supposed to be installed). The phrase "gaming machine" as used herein describes typical gaming machines as well as other gaming related, computing systems, such as game servers and the like. Accordingly, the phrase "gaming units" as used herein describes groupings of gaming-related components and associated system components. In this way, the resultant examination of installed component data and registered component data is used to determine whether the gaming units, or individual components of the gaming units, may be enabled before starting or continuing operation. Preferably, the verification system and method also monitors changes and updates to the components of the gaming units, identifies service that has been performed on the components, verifies that the requirements for proper operation of a gaming unit are satisfied by enabled and non-enabled components, and determines the productivity of a gaming unit.

In one preferred embodiment, the verification system includes an operational component registry having a memory device, an interface, and a processor. The memory device stores registered identification data and installed identification data for one or more gaming units. The gaming units themselves each include one or more components. Preferably, the components include by way of example only, and not by way of limitation, hardware (e.g., a hard drive, non-volatile RAM, and the like), software, and other gaming machine system components (e.g., a gaming machine cabinet). The interface communicates the installed identification data from the gaming units to the operational component registry. Additionally, the processor analyzes the registered identification data and the installed identification data of the gaming units. The processor then, by examining the registered identification data (i.e., data detailing what is supposed to be installed) with the installed identification data (i.e., data detailing what is actually installed), determines whether or not the gaming units are allowed to be enabled.

In accordance with another preferred aspect of the verification system, the registered identification data includes identification data for the components that are supposed to be installed on the gaming units. Preferably, the installed identification data for the gaming units includes identification data for the components that are actually installed on the gaming units. Typically, in a preferred embodiment the registered identification data is authenticatible and non-repudiatible, rather than hidden or otherwise obfuscated (encrypted). Accordingly, the registered identification data and the installed identification data must be authenticated prior to examination by the processor. Non-repudiation is a way to guarantee that the sender of a message cannot later deny having sent the message, and that the recipient cannot deny having received the message.

In accordance with another preferred aspect of the verification system, both the registered identification data and the installed identification data for the gaming units include unique identifiers for each of the components that either are supposed to be installed or are actually installed on a gaming unit. Preferably, the registered identification data and installed identification data for the hardware include, by way of example only, and not by way of limitation, one or more of: serial numbers, model numbers, part numbers, location information, manufacture date, installation date, and repair date. Further, in a preferred embodiment the registered identification data and installed identification data for the software include, by way of example only, and not by way of limitation, one or more of: globally unique identifiers, version information, licensing information, installation date, patch date, repair date, signature data, hash data, and authentication data.

In accordance with another preferred aspect of the verification system, the operational component registry is resident on a central gaming system to which the gaming units are connected. In another preferred embodiment, the operational component registry is resident on a wide area gaming system to which the gaming units are connected. In still another preferred embodiment, the operational component registry is resident on a local area gaming system to which the gaming units are connected. In yet another preferred embodiment, the operational component registry is resident on a gaming unit. In a further preferred embodiment, the operational component registry is utilized with additional operational component registries within a system of gaming units.

In accordance with another aspect of the verification system, the operational component registry further includes an update process. In a preferred embodiment, a change log is produced during the update process that catalogs the results of the update process. Preferably, the change log includes identification data regarding authorized changes and updates that occurred to the components of the gaming units during the update process. Specifically, the update process is used to amend the operational component registry to include registered identification data for authorized changes and updates to installed components. Preferably, technology such as digital signature verification, message authentication code, bindings, and electronic keys (BKEYs) are used to verify, authenticate, and/or authorize the validity of these changes.

In one preferred embodiment of the verification system, the operational component registry is amended, at predetermined intervals, using the update process to enable the operational component registry to include the registered identification data for authorized changes and updates to the installed components that were added during the update process. In another preferred embodiment of the verification system, the operational component registry is amended, in response to a request, using the update process to enable the operational component registry to include registered identification data for authorized changes and updates to installed components that were added during the update process.

In accordance with another aspect of the verification system, the operational component registry further includes service processes. In one preferred embodiment, a service log is produced during the service processes that catalog the results of the service processes. Preferably, the service log includes information regarding diagnostic and maintenance services performed on components of the gaming units during the service processes. As stated above, the phrase "gaming units" as used herein, describes groupings of gaming related components (e.g., gaming machines, gaming systems, gaming servers, and the like) as well as associated system components. In accordance with another aspect of the verification system, the operational component registry further includes a productivity log. In one preferred embodiment, the productivity log includes information regarding productivity of the gaming units.

In accordance with still another aspect of the verification system, the operational component registry further includes a requirements log. In one preferred embodiment, the requirements log includes data used to verify whether enablement of a particular component is required for proper operation of the gaming units. The requirements log preferably includes rules for the processor to use in determining whether or not the gaming units (or subsets of the components comprising the gaming units) are allowed to be enabled, when the processor examines the registered identification data (i.e., data detailing what is supposed to be installed) and the installed identification data (i.e., data detailing what is actually installed).

In accordance with another aspect of the verification system, the communication of the installed identification data from the gaming units to the operational component registry occurs at predetermined intervals. In one preferred embodiment, the communication of the installed identification data from the gaming units to the operational component registry occurs in response to a request. Additionally, in one preferred embodiment, the operational component registry further includes at least one user access port that is configured to provide access to the registry in an embodiment where the operational component registry is remotely located.

In accordance with one aspect of the verification system, the update process is used to update the registered identification data with authorized changes and updates to the components. In one preferred embodiment, the gaming units have components with non-corresponding identification data that are not enabled. Correspondingly, in this embodiment the gaming units have corresponding identification data for all components that are enabled. Additionally, in one preferred embodiment, the non-enablement of one or more non-corresponding components of a gaming unit initiates a determination process, during which it is established whether enablement of the gaming unit is prevented. Conversely, in another preferred embodiment, enablement of a gaming unit is permitted regardless of whether any components having non-corresponding identification data are identified in the gaming unit. In accordance with another aspect of the verification system, the operational component registry further includes an enablement log. Preferably, the enablement log includes data that is utilized by the processor to assist in determining enablement or non-enablement of the gaming units (as well as of individual components of the gaming units).

In another preferred embodiment of the verification system, the operational component registry includes a catalog of registered identification data and a catalog of installed identification data. The term "catalog" as used herein, refers simply to the data files themselves and not to the memory device on which the data files reside. The registered identification data preferably includes identification data for components registered as being installed (i.e., are supposed to be installed) on one or more of the gaming units. Additionally, the installed identification data preferably includes identification data for components that are actually installed on the gaming units.

In one preferred embodiment of the verification system, the operational component registry further comprises a memory device that stores a catalog of the registered identification data and a catalog of the installed identification data, a processor that analyzes the registered identification data and the installed identification data, and an interface between the operational component registry and the gaming units. Preferably, the components include both hardware and software.

In accordance with another aspect of the verification system, the claimed invention utilizes "component binding" for cryptographic security. In component binding, some components, like the motherboard, the cabinet, the hard drive, and the non-volatile RAM (such as battery-backed Safe RAM), are issued identification numbers. When these numbers are cryptographically secured together collectively in a grouping, this protected grouping is referred to as a "binding." Each component of the machine contains its portion of the binding. The collected bindings are not stored anywhere.

In one such preferred embodiment, every critical log entry made on the hard drive and every critical entry on the non-volatile RAM is signed with a Hashed Message Authorization Code (HMAC) that is based on the entry itself, and on the individual binding codes. In this manner, the security produced by the bindings ensures that log entries that are made cannot be falsified or repudiated. In such an embodiment, even if the hard drive and/or non-volatile RAM are removed from a machine, an entry cannot be falsified unless the binding numbers from the motherboard, and cabinet are all known.

In accordance with one preferred embodiment of the verification system, one or more gaming machine system components are assigned identification codes. The components are grouped together into a protected group of component bindings using cryptographic security procedures and the identification codes of the components in the bindings group. Accordingly, the bindings prevent falsification or repudiation of log entries with respect to any modifications or replacements of components within the bindings group.

In another preferred embodiment, the component bindings verification system for gaming machine system components includes, the gaming machine system components, identification codes, and a protected grouping of gaming machine system components that form the component bindings. Preferably, the gaming machine system components include at least non-volatile RAM, a cabinet, and a hard drive. Typically, an identification code is assigned to each gaming machine system component. The protected grouping of components form component bindings using cryptographic security procedures and the identification codes of the components in the bindings group. The bindings prevent falsification or repudiation of log entries with respect to any modifications or replacements of components within the bindings group.

In accordance with another aspect of the verification system, every log entry made on the hard drive and every entry made on the non-volatile RAM, must be authenticated by being digitally signed with a Hashed Message Authorization Code that is based on the entry itself and on the individual identification codes of the components in the bindings group. In the same manner, every log entry that attempts a replacement of any of the gaming machine system components must be authenticated by being digitally signed with a Hashed Message Authorization Code that is based on the entry itself and on the individual identification codes of the components in the bindings group.

Preferably, the identification codes of the gaming machine system components are randomly or pseudo-randomly generated. In accordance with another aspect of the verification system, a Hashed Message Authorization Code key for authenticating access to the component bindings is produced using a SHA-1 hash that is generated using the individual identification codes of the components in the bindings group. Additionally, the gaming machine system components are secured within the component bindings using a SHA-1 hash that is generated using the individual identification codes of the components in the bindings group.

Another preferred embodiment of the claimed invention utilizes a method for verifying components of one or more gaming units using an operational component registry. The method includes: selecting one or more gaming units for verification; establishing communication with the selected gaming units; receiving installed identification data into the operational component registry from the selected gaming units regarding components actually installed on the selected gaming units; and examining the installed identification data and registered identification data stored on the operational component registry to determine enablement of the gaming units.

Still another preferred embodiment of the claimed invention utilizes a method for verifying and selectively enabling gaming units. This method includes: receiving installed identification from one or more gaming units to an operational component registry through an interface on the operational component registry; storing registered identification data and installed identification data on a memory device located within the operational component registry; and examining the registered identification data and the installed identification data on a processor in the operational component registry to determine enablement via the gaming units.

In one preferred embodiment, the verification method prevents falsification and repudiation of log entries with respect to modifications and replacements in gaming machine system components. Preferably, the verification method includes: assigning identification codes to gaming machine system components within a gaming unit, wherein the gaming machine system components include at least non-volatile RAM, a cabinet, and a hard drive; binding together one or more gaming machine system components into a protected group of component bindings using cryptographic security procedures and the identification codes of the components in the bindings group, and wherein the bindings prevent falsification or repudiation of log entries with respect to any modifications or replacements of components within the binding group.

Other features and advantages of the claimed invention will become apparent from the following detailed description, taken in conjunction with the accompanying drawings, which illustrate by way of example, the features of the claimed invention.

DETAILED DESCRIPTION OF THE PREFERRED EMBODIMENTS

A preferred embodiment of the verification system has an operational component registry that identifies all components installed on one or more gaming units and verifies that these "installed components" correspond to the "registered components." Otherwise stated, the operational component registry verifies that the components that are actually installed on a gaming machine correspond to the components that are supposed to be installed on that gaming machine. The resultant examination of the installed component data and registered component data is used to determine whether the gaming units, or individual components of the gaming units, may be enabled before starting or continuing operation. Preferably, the verification system also monitors changes and updates to the components of the gaming units, identifies services that have been performed on the components, verifies that requirements for proper operation of a gaming unit are satisfied, and determines the productivity of a gaming unit.

Figure 1:
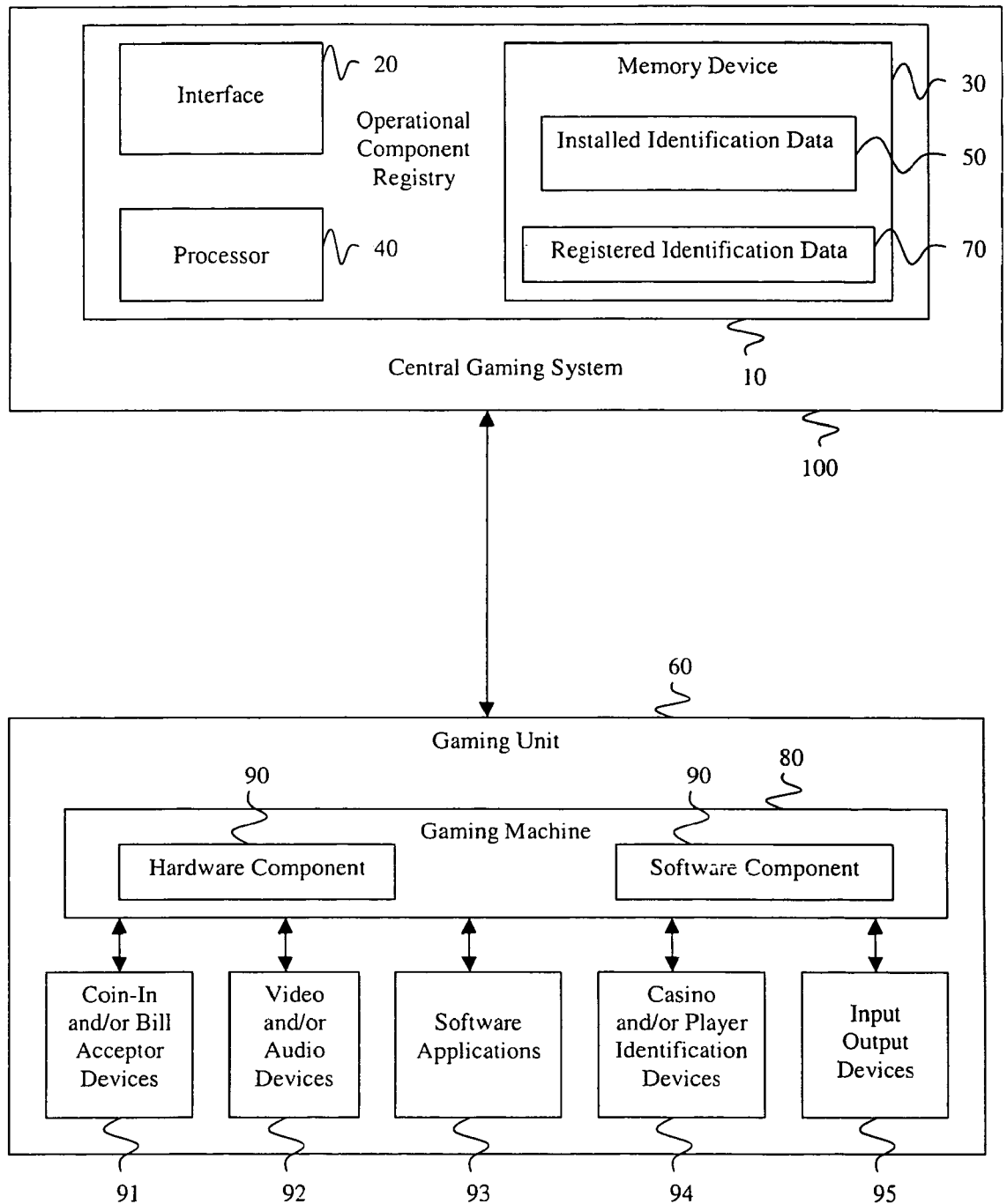
FIG. 1 illustrates a gaming system that utilizes a verification system having operational component registry, which is resident on the central gaming system, and wherein the operational component registry is connected to a gaming unit having a single gaming machine that includes various hardware and software components.

Referring now to the drawings, wherein like reference numerals denote like or corresponding parts throughout the drawings, and more particularly to FIGS. 1-6, there is shown a preferred operational component registry 10 of the verification system. As shown in FIG. 1, a preferred embodiment of the verification system has an operational component registry 10 that includes an interface 20, a memory device 30, and a processor 40. Preferably, the interface 20 in the operational component registry 10 communicates the installed identification data 50 from gaming units 60 to the operational component registry. The memory device 30 preferably stores registered identification data 70 and installed identification data 50 for the gaming units 60. In a preferred embodiment, the processor 40 in the operational component registry 10 then analyzes the registered identification data 70 and the installed identification data 50 from the gaming units 60, after which enablement of the gaming units is determined based upon the examination of the registered identification data and the installed identification data.

Notably, each gaming unit 60 preferably includes a gaming machine 80 having one or more components 90. Further, the gaming units 60 may include additional components 90 that are not part of a gaming machine 80. Typically, each component 90 is either hardware, software, or some other gaming system related component. In a preferred embodiment, the registered identification data 70 for each gaming unit 60 includes identification data for the components 90 that are supposed to be installed on each gaming unit. Correspondingly, the installed identification data 50 for the gaming units 60 preferably includes identification data for the components 90 that are actually installed on the gaming units.

In the preferred embodiment illustrated in FIG. 1, the verification system has an operational component registry 10 that is resident on a central gaming system 100. As discussed above, in one preferred embodiment, the interface 20 is used to communicate the installed identification data 50 from the gaming units 60 and the operational component registry 10. Preferably, the communication of the installed identification data 50 occurs (1) at predetermined intervals, (2) in response to a request, or (3) in response to a triggering event. Additionally, in some embodiments the interface 20 resides on the operational component registry 10, while in other embodiments the interface 20 is remote to the operational component registry. In some embodiments, more than one interface 20 is used to communicate the installed identification data 50 from the gaming units 60 to the operational component registry 10. Further, in some embodiments the interface 20 resides within the operational component registry 10, while in other embodiments the interface is remote to the operational component registry. Examples of the interface 20 include, by way of example only, and not by way of limitation, a serial port, a parallel port, a universal serial bus (USB) port, a RS-232 port, an I²C (Inter-Integrated Circuit) port, an Ethernet port, an infrared port, a binary port, a TTL (transistor-transistor logic) port, an IEEE 1394 "fire wire" port, or a wireless port.

Preferably, once the installed identification data 50 has been communicated to the operational component registry 10, the processor 40 performs an analysis of the registered identification data 70 and the installed identification data 50 for each component 90 of the gaming units 60. That is, the registered identification data 70 is compared with the installed identification data 50, and matching and non-matching identification data is determined for each component 90. From the matching and non-matching identification data, the enablement or non-enablement of the gaming units 60 (or of individual components 90 on the gaming units) is determined. Additionally, in some preferred embodiments, the operational component registry 10 is associated with more than one processor 40. Further, in some preferred embodiments, the processor 40 is remote from the operational component registry 40.

In the embodiment shown in FIG. 1, a central gaming system 100 is in communication with a gaming unit 60 and its associated gaming machine 80. Preferably, the gaming machine 80 is configured with a variety of components depending on its gaming applications. In one preferred embodiment, a gaming machine 80 includes coin-in and/or bill acceptor devices 91, video and/or audio devices 92, various software applications 93, casino and/or player access/identification devices 94, and miscellaneous input/output devices 95 that are necessary for the proper operation of the gaming machine 80.

Figure 2:
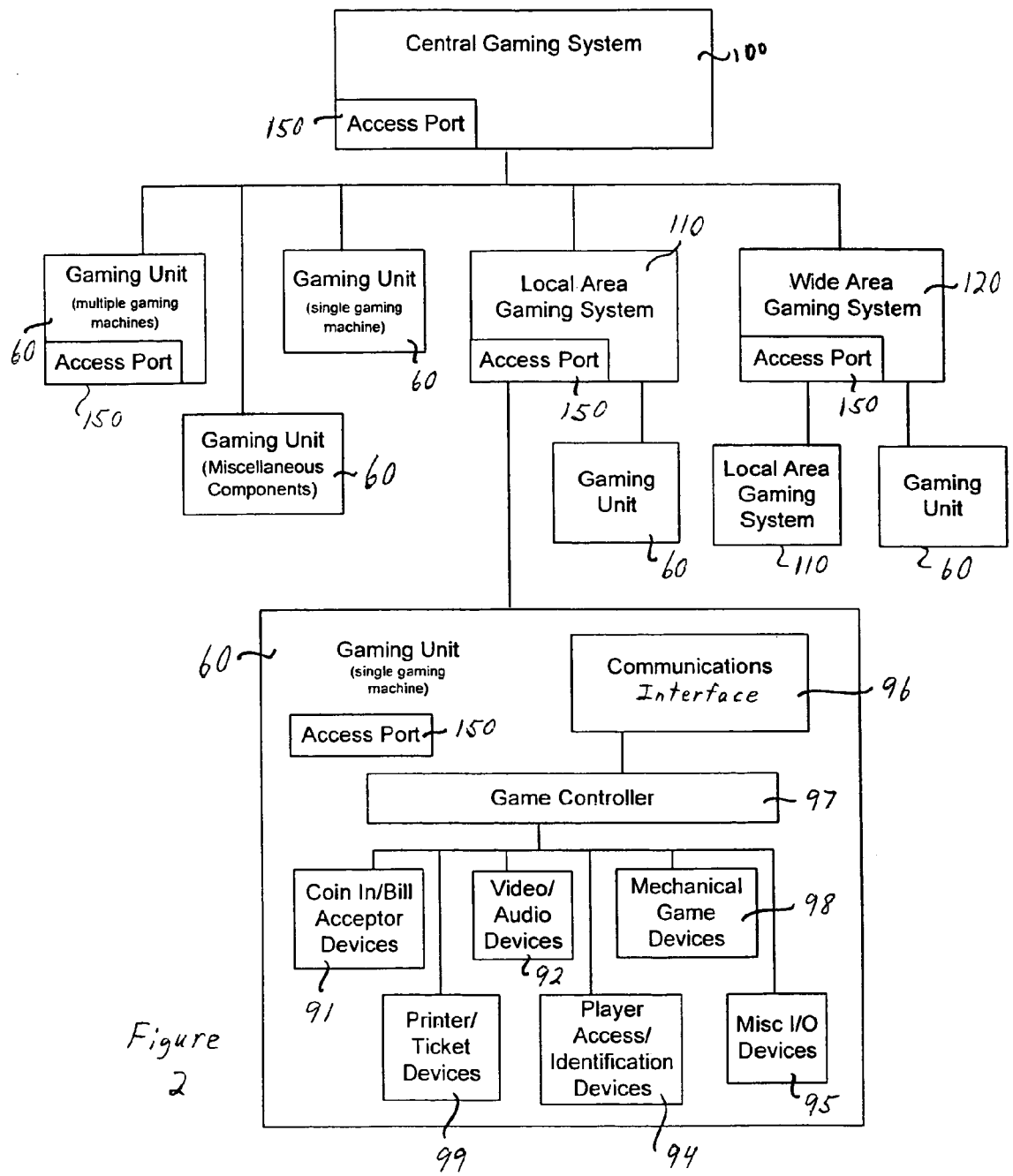
FIG. 2 illustrates a gaming system having a central gaming system, a wide area gaming system, a local area gaming system, wherein the gaming units include single gaming machines, multiple gaming machines, and/or miscellaneous components.

Referring now to FIGS. 1 and 2, the gaming systems in which the gaming units 60 are contained may be organized in a variety of different configurations. These include, by way of example only, and not by way of limitation, a central gaming system 100, a local gaming system 110, and a wide area gaming system 120. Further, a gaming unit 60 may be defined as including only a single gaming machine 80, multiple gaming machines 80, or a gaming machine 80, as well as other components 90. Typically, a central gaming system 100 is a gaming communication and control system that controls a network of gaming machines 80 and gaming systems. However, in a preferred embodiment, a central gaming system 100 may be used, not for real-time gaming, but rather for the gradual migration of data. Preferably, the central gaming system 100 may be used for material requirements planning. Such a central gaming system 100 may further include capabilities for outcome determination, configured control, jurisdictional optioning, and marketing content distribution.

Continuing, a local area gaming system 110 preferably includes a communication and control system that covers gaming machines 80 and gaming systems located over a relatively small geographic area. In contrast, a wide area gaming system 120 is a gaming communication and control system that covers gaming machines and gaming systems located over a wide geographic area. In one preferred embodiment, a wide area gaming system 120 may refer to a gaming system for a specific jurisdictional area. Both central gaming systems 100 and wide area gaming systems 120 may include smaller subsets of gaming systems, such as a local area gaming system 110 or groupings of gaming units 60.

As shown in FIG. 2, a gaming unit 60 is shown with multiple additional components that include, by way of example only and not by way of limitation, a communications interface 96, a game controller 97, coin in/bill acceptor devices 91, video/audio devices 92, player access/identification devices 94, miscellaneous input/output devices 95, mechanical game devices 98, and printer/ticket devices 99. Preferably, the components 90 of a gaming unit 60 include hardware and software. Moreover, access ports 150 are preferably provided at multiple locations in a gaming system (e.g., a central gaming system 100, a local area gaming system 110, a wide area gaming system 120, or a single gaming unit 60). Through these access ports 150, a user can access and manipulate the data in the operational component registry 10. Examples of these access ports 150 include, by way of example only, and not by way of limitation, a serial port, a parallel port, a universal serial bus (USB) port, a RS-232 port, an I²C (Inter-Integrated Circuit) port, an Ethernet port, an infrared port, a binary port, a TTL (transistor-transistor logic) port, an IEEE 1394 "fire wire" port, or a wireless port.

Figure 3:
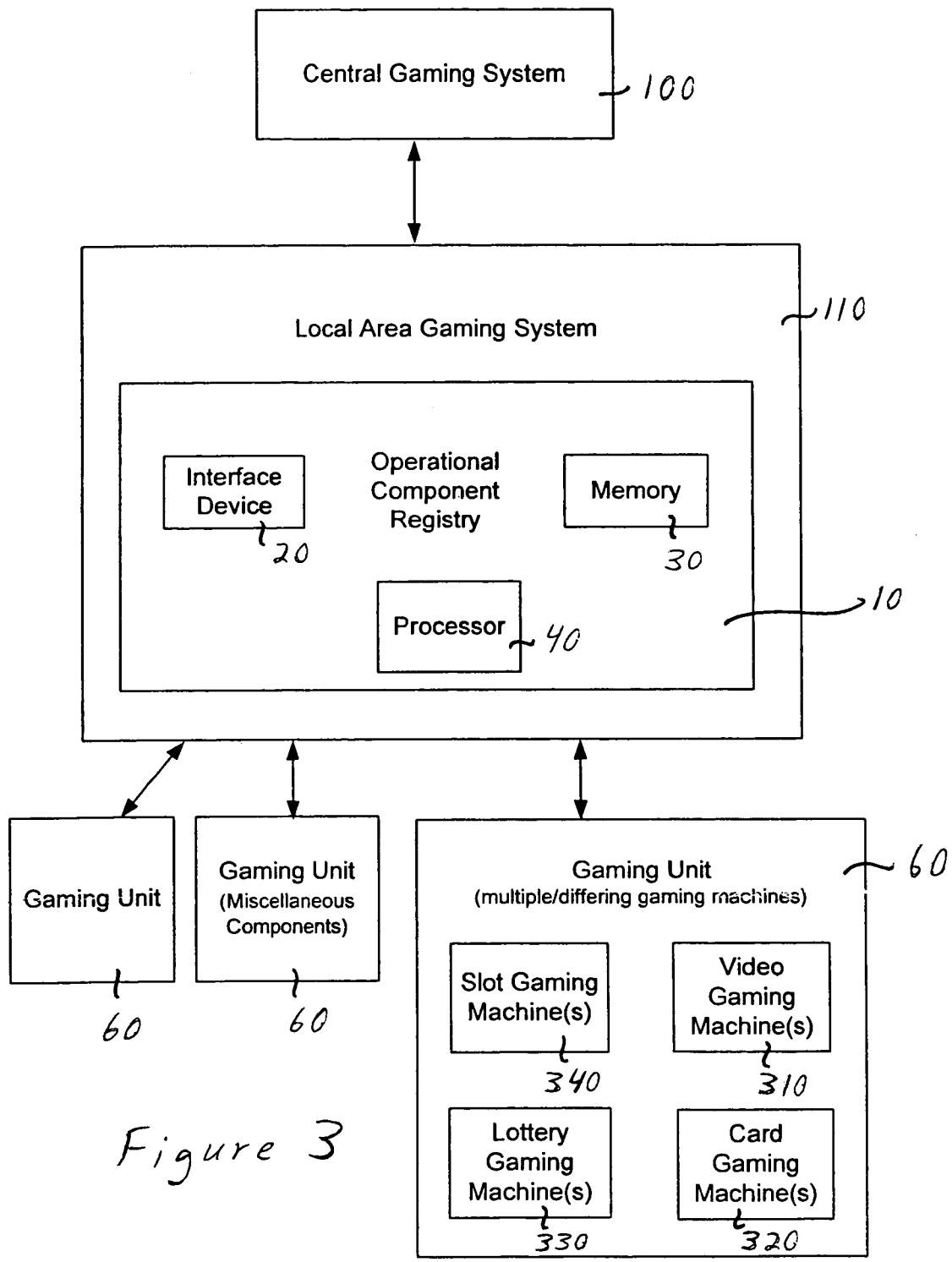
FIG. 3 illustrates a gaming system in which the operational component registry is resident on a local gaming system and includes an interface, a processor, and a memory device, as well as a gaming unit having multiple and differing gaming machines grouped therein.

Referring now to FIGS. 1 and 3, a preferred embodiment of the verification system has an operational component registry 10 that is shown as resident on a local area gaming system 110. In this embodiment, the operational component registry 10 includes at least one memory device 30, at least one processor 40, and at least one interface 20. Connected to the local area gaming system 110 are three gaming units 60. As discussed above, some gaming units 60 include additional (possibly non-gaming) components 90, as well as one or more gaming machines 80. Accordingly, these components 90 may be part of the gaming machine 80, or may not be directly related to gaming. Thus, in one preferred embodiment, the operational component registry 10 is utilized in conjunction with components 90 that are not directly related to gaming, such as vending machines, automated information services, or other electromechanical applications.

FIGS. 3 also illustrate a gaming unit 60 that includes multiple differing gaming machines 80. As shown in one embodiment, different types of gaming machines 80 are grouped into a single gaming unit 60. Such differing types of gaming machines 80 include, by way of example only and not by way of limitation, video gaming machines 310, card gaming machines 320, lottery gaming machines 330, and/or slot gaming machines 340.

Moreover, in another preferred embodiment of the verification system shown in FIG. 1 and 3, the operational component registry 10 is used to verify the components 90 of only a portion of the gaming unit 60. In one such preferred embodiment, the operational component registry 10 is used to only check the components 90 in the gaming machine 80 portion of a gaming unit 60 and not the additional non-gaming machine components 90. Thus, the operational component registry 10 may be configured to verify the components 90 of an entire system, the components of a particular gaming unit 60, the components of a particular gaming machine 80, or merely a single component.

Another preferred embodiment of the verification system utilizes "component bindings" for verification using cryptographic security. In component binding, some components, like the CPU chip and the cabinet, come equipped with unalterable serial numbers. Additionally, components such as the cabinet may also be given another random identification number by the owner. Other components in the system, such as the CMOS memory in the motherboard, the hard drive, and the non-volatile RAM, are also issued random identification numbers. When these numbers are secured together collectively in a grouping, this protected grouping is referred to as a "binding." Each component of the machine contains its portion of the binding. The collected bindings are not stored anywhere.

In one such preferred embodiment, every critical log entry made on the hard drive and every critical entry on the non-volatile RAM is signed with a Hashed Message Authorization Code (HMAC) that is based on the entry itself, and on the individual binding codes. In this manner, the security produced by the bindings ensures that log entries that are made cannot be falsified or repudiated. In such an embodiment, even if the hard drive and/or non-volatile RAM are removed from a machine, an entry cannot be falsified unless the binding numbers from the all of the components in the bindings group (e.g., the CPU, motherboard, and cabinet) are all known.

After the critical gaming and/or system components are selected, given individual identifiers, and combined into a protected grouping that is secured using the component "bindings," any changes to those components will then be detected, authorized, and logged. For example, application log entries on a component within the binding are digitally signed (SHA-1) using the key derived from the bindings. This signature is verified whenever an entry is made to a component within the binding. If the signature is wrong, this security violation and the violator are noted, but typically the entry is not prohibited. Thus, the component binding produce a cryptographic audit trail of the individuals making changes to any of the components within the binding.

Moreover, bindings ensure that the critical components of a gaming machine system that have been selected to be components within the binding have not been swapped in an un-authorized manner. Preferably, bindings use unique identification numbers that are assigned to vital parts of the gaming platform including, by way of example only, and not by way of limitation, the cabinet, motherboard, specific software, non-volatile RAM card, and hard drive. These identification numbers combined in a cryptographic manner to form a "binding" that protects and virtually encloses the included components, such that no component within the binding can be modified, removed, or replaced without creating an audit trail and requiring authentication. Thus, for one of these components within the binding to be changed, appropriate authentication is required and a log file entry is made documenting the activity and the identity of the individual making the change. In one preferred embodiment, a specific level of BKEY is required to make the changes.

In one preferred embodiment, the Secure Hash Function-1 (SHA-1) is used to compute a 160-bit hash value from the data file or firmware contents. This 160-bit hash value, which is also called an abbreviated bit string, is then processed to create a signature of the game data using a one-way, private signature key technique, called Digital Signature Algorithm (DSA). The DSA uses a private key of a private key/public key pair, and randomly or pseudo-randomly generated integers, to produce a 320-bit signature of the 160-bit hash value of the data file or firmware contents. This signature is stored in the database in addition to the identification number.

For example, prior to binding a 256-bit random number is generated and stored for the cabinet. Additionally, a 128-bit random number is generated and stored on the non-volatile RAM. Further, another 128-bit random number is generated and stored on the hard drive. Additionally, yet another 128-bit random number is generated and stored in the CMOS memory of the CPU board. Then, to create the HMAC key and bind the components, a SHA1 hash is produced using all those numbers (i.e., all of the components in the binding group). This 160-bit result is the HMAC key, which is never stored anywhere except for in RAM. Thus, for this embodiment, the cabinet, the CMOS memory of the CPU board, the hard drive, and the non-volatile RAM (i.e., all of the components in the binding group) are all needed to create this key. Without all of these components (and associated component identification codes) the key cannot be created, and without the key signed entries cannot be forged.

Figure 4:
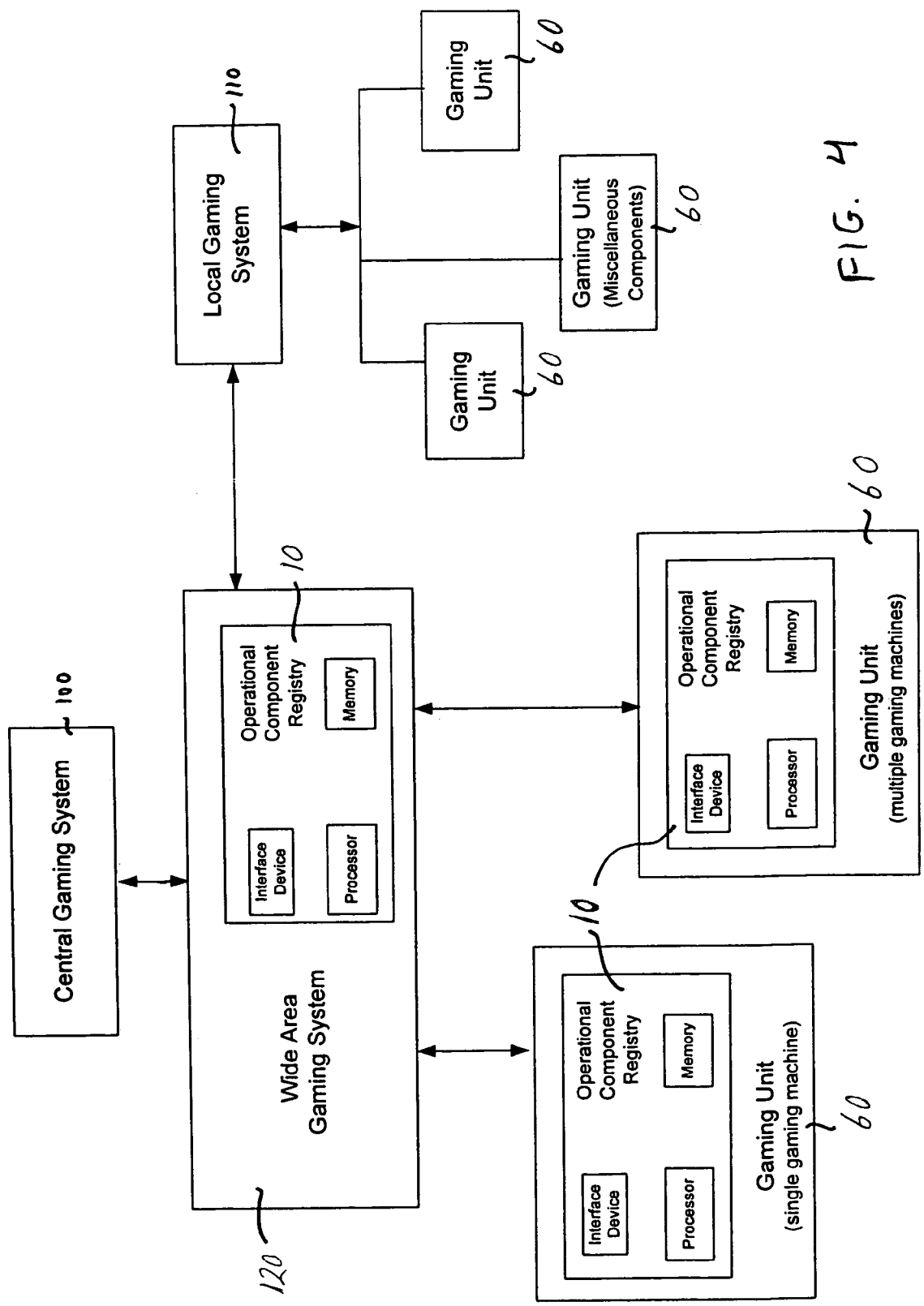
FIG. 4 illustrates a gaming system that includes multiple operational component registries.

Referring now to FIG. 4, a verification system is shown that uses multiple operational component registries 100. In this preferred embodiment of the verification system, a central gaming system 100 communicates with a wide area gaming system 120. The wide area gaming system 120 in turn communicates with multiple gaming units 60 and with a local gaming system 110. In this preferred embodiment, the operational component registry 10 is resident on more than one portion of a system. Specifically, the operational component registry 10 is shown as resident on (1) a wide area gaming system 120, (2) a gaming unit 60 comprising a single gaming machine, and (3) a group of gaming units 60.

Figure 5:
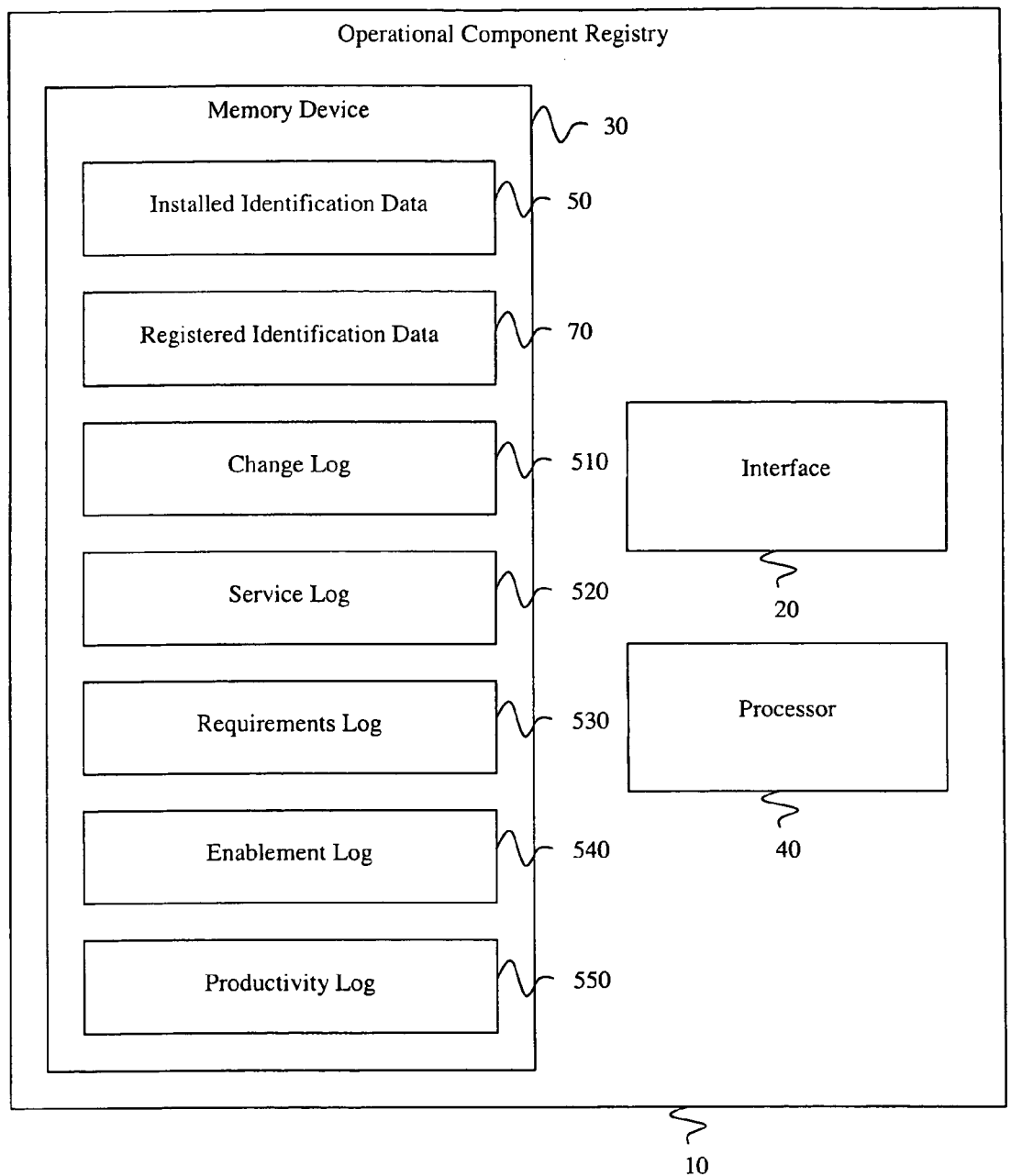
FIG. 5 illustrates the memory device of an operational component registry that preferably includes installed identification data, registered identification data, a change log, a service log, a requirements log, an enablement log, and a productivity log.

FIG. 5 illustrates a preferred embodiment of the verification system having an operational component registry 10 that includes a plurality of additional data files, including a change log 510, a service log 520, a requirements log 530, an enablement log 540, and a productivity log 550 (as well as the above-discussed installed identification data 50 and registered identification data 70). In one preferred embodiment, each of these additional data files is stored in the operational component registry 10, while in another preferred embodiment, one or more of these data files are transmitted to the operational component registry from another location. Otherwise stated, the change log 510, service log 520, requirements log 530, enablement log 540, and productivity log 550 may each either be initially stored in the operational component registry 10 or transmitted from a remote location to the operational component registry. As discussed above, the registered identification data 70 is typically stored in the operational component registry 10, while the installed identification data 50 is typically transmitted from another location.

In a preferred embodiment of the verification system, each of the above-discussed data files in the operational component registry 10 is authenticatible and non-repudiatible, thereby increasing security of the system and helping to prevent unauthorized access. Other forms of authorization and security may also be used. Typically, when data files are made authenticatible and non-repudiatible, it is also necessary to authenticate the data files before processing the data.

In a preferred embodiment, at least one of the registered identification data 70 and the installed identification data 50 is authenticatible and non-repudiatible. Accordingly, in such an embodiment, authentication is performed before the registered identification data 70 and the installed identification data 50 are examined.

Referring now to FIG. 1 and 5, in a preferred embodiment of the verification system, the registered identification data 70 and the installed identification data 50 in the operational component registry 10 contain unique identifiers for each component 90. As discussed above, these components 90 preferably include hardware and software, each of which has unique data characteristics. In one preferred embodiment, the registered identification data 70 and installed identification data 50 for hardware components 90 include, by way of example only and not by way of limitation, serial numbers, model numbers, part numbers, manufacture date, location information, installation date, repair date, and other unique identifying data. In another preferred embodiment, the registered identification data 70 and installed identification data 50 for software components 90 include, by way of example only and not by way of limitation, globally-unique identifiers, version information, licensing information, installation date, patch or repair date, signature data, hash data, authentication data, and other unique identifying data. Accordingly, any type of data characteristics (or combination of data characteristics) that uniquely identifies a component 90 may be used by the operational component registry 10 for verification purposes.

In a preferred embodiment of the verification system, the update process authorizes changes and updates to the components 90 of the gaming units 60. In a preferred embodiment, a change log is produced during the update process that catalogs the results of the update process. Preferably, the update process is used to amend the registered identification data 70 on the operational component registry 10 to include identification data for authorized changes and updates to installed components on the gaming units 60. In preferred embodiments, updates to the registered identification data 70 that are made using the update process occur either at predetermined intervals, in response to a request, or in response to a triggering event. Thus, in one preferred embodiment, the user configures the update process to automatically update the registered identification data 70. In another preferred embodiment, the user sends a request to update the registered identification data 70 through the access port 150 (shown in FIG. 2) or other input device, which results in the initiation of the update process. Finally, in still another preferred embodiment, updates to the registered identification data 70 occur in response to a triggering event, such as the identification of registered identification data 70 and installed identification data 50 that is non-corresponding.

A preferred embodiment of the verification system also includes a service log 520. Preferably, the service log 520 includes information regarding diagnostic and maintenance services performed on components 90 of the gaming units 60. In this regard, any service that is performed on a component 90 is recorded in the service log 520. Thus, the service log 520 preferably provides a trackable record of any and all repairs, replacements, and/or tampering with components 90 of the gaming units 60.

A preferred embodiment of the verification system further includes a requirements log 530. Preferably, the requirements log 530 contains data that is used to determine the operational requirements for a particular gaming unit 60. In one preferred embodiment, the requirements log 530 is used to determine whether the non-enablement of a component 90 in a gaming unit 60 will prevent the proper operation of that gaming unit. If proper operation of the gaming unit 60 is not possible with the component 90 being non-enabled, the operational component registry 10 prevents the enablement of the gaming unit associated with the non-enabled component. Otherwise stated, the requirements log 530 preferably includes rules for the processor 40 to use in determining whether or not the gaming units 60 (or subsets of the components comprising the gaming units) are allowed to be enabled.

In a preferred embodiment, the verification system also includes an enablement log 540. Preferably, the enablement log 540 contains data that is transmitted and stored regarding the enablement or non-enablement of gaming units 60, and/or of individual components 90 of the gaming units. In one preferred embodiment, the enablement log 540 contains an "override" command that is used to permit operation of a gaming unit 60, even though there is non-corresponding data for one or more components 90 of the gaming unit 60, and the components are identified by the requirements log 530 as necessary for the proper operation of the gaming unit.

In another aspect of a preferred embodiment, the verification system also includes a productivity log 550 that provides information regarding the productivity of one or more gaming units 60. Preferably, the operational component registry 10 is used to track the performance and productivity of the gaming units 60. In one preferred embodiment, the productivity log 550 of the operational component registry 10 tracks the coin-in, the win ratio, the play time, and various other factors that are potentially indicative of productivity.

Figure 6:
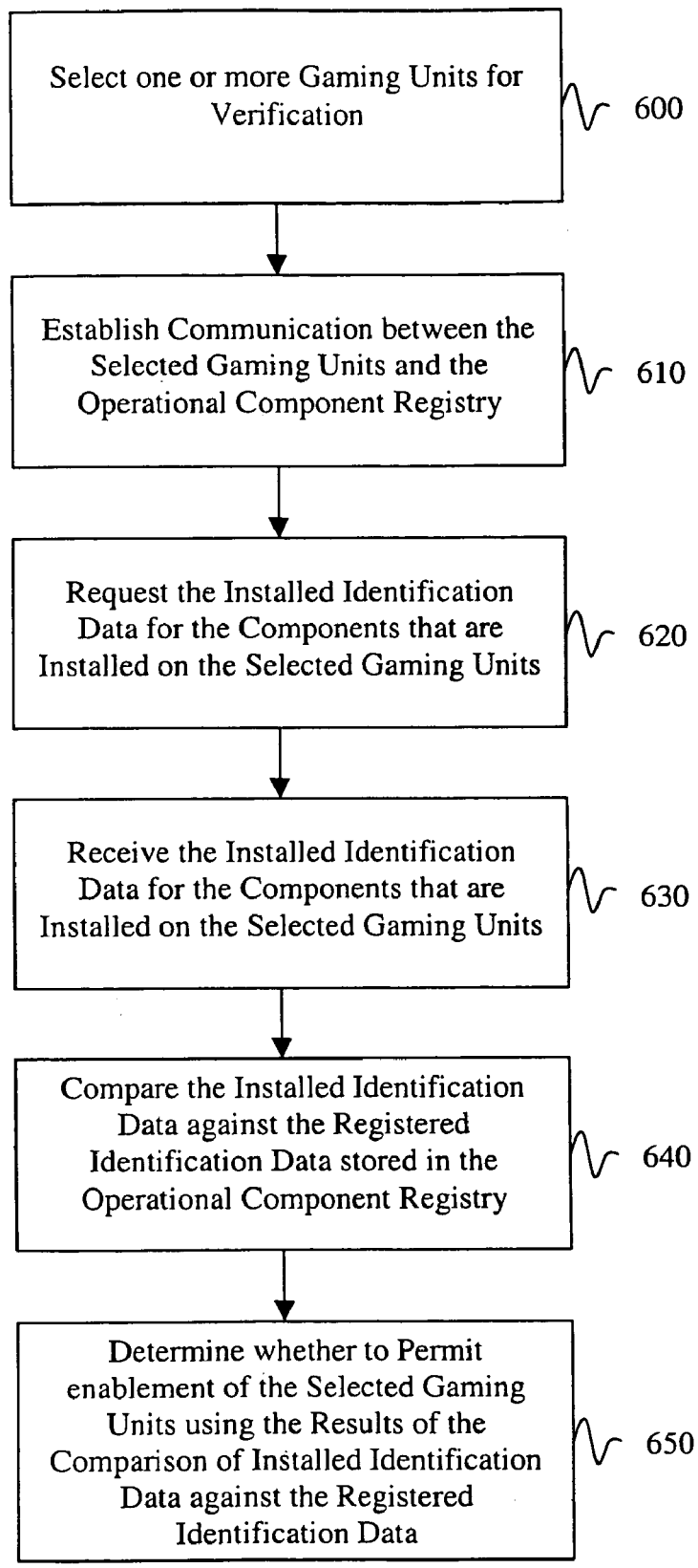
FIG. 6 illustrates a method utilizing an operational component registry for checking gaming units and/or individual components, and determining whether to permit enablement of the gaming units and/or individual components.

Referring now to FIG. 6 (as well as FIG. 1), a preferred embodiment method is shown for checking and verifying one or more gaming units 60 (or individual components 90), using an operational component registry 10. A preferred method includes, at Step 600, selecting one or more gaming units 60 for verification. At Step 610 communication is established between the selected gaming units 60 and the operational component registry 10. At Step 620 the installed identification data 50 is requested for components 90 that are installed on the selected gaming units 60. Next, at Step 630, the installed identification data 50 is received by the operational component registry 10 from the selected gaming units 60. Continuing, at Step 640, the installed identification data 50 is examined with respect to the registered identification data 70 stored on the operational component registry 10. Lastly, this preferred method further includes, at Step 650, determining whether to permit enablement of the selected gaming units 60 (or individual components 90), using the results of the examination of the installed identification data 50 with respect to the registered identification data 70.

Referring again to FIG. 5 (as well as FIG. 1), in some preferred embodiments, the method also includes determining whether any changes have been made to the installed components. Preferably, this is accomplished by querying the change log 510 and the selected components 90 to determine whether any changes or updates have been made since the last request for installed identification data 50. In a preferred embodiment, if a change or update is found to have occurred to the installed components, the installed identification data 50 is communicated to the operational component registry 10, and the information is updated. The operational component registry 10 then preferably verifies that the changes to the installed components are authorized, and that the requirements for proper operation of the gaming units 60 (or components 90) are satisfied.

In this preferred embodiment, the requirements log 530 then confirms that the software change is authorized (e.g., a license is available, the software is the proper version, and the like). Preferably, the requirements log 530 also confirms that the software permits proper operation of the gaming unit 60. After confirming that all of the requirements are satisfied, the operational component registry 10 is amended to include the registered identification data 70 for the changed components. Once the updates have been entered, the installed identification data 50 and the updated registered identification data 70 are the examined. Using the results from this examination, the operational component registry 10 determines whether to permit enablement of the gaming units 60 or the individual components 90 of the gaming units.

Furthermore, the various systems and methodologies described above are provided by way of illustration only and should not be construed to limit the invention. Those skilled in the art will readily recognize that various modifications and changes may be made to the claimed invention without departing from the true spirit and scope of the claimed invention. Accordingly, it is not intended that the claimed invention be limited, except as by the appended claims.

What is claimed is:

1. A verification system utilizing an operational component registry in a gaming environment, the verification system comprising:

a memory device, wherein the memory device stores a catalog of registered identification data for multiple components supposed to be installed on multiple gaming units, wherein the components include hardware and software, and each gaming unit includes multiple components with identification data;

an interface that communicates a catalog of installed identification data for multiple components that are actually installed on the gaming units from the gaming units to the operational component registry; and a processor that analyzes the registered identification data and the installed identification data of the components installed on the gaming units; and wherein enablement of the gaming units is determined by examining the registered identification data and the installed identification data.

2. The verification system of claim 1, wherein the registered identification data for the gaming units includes identification data for the components that are supposed to be installed on the gaming units.

3. The verification system of claim 2, wherein the installed identification data for the gaming units includes identification data for the components that are actually installed on the gaming units.

4. The verification system of claim 1, wherein the registered identification data is authenticatible and non-repudiatible.

5. The verification system of claim 3, wherein the registered identification data and the installed identification data for the gaming units includes unique identifiers for each of the components that are supposed to be installed or that are actually installed on a gaming unit.

6. The verification system of claim 5, wherein the registered identification data and installed identification data for the hardware includes data selected from the group of serial numbers, model numbers, part numbers, a manufacture date, location information, an installation date, and a repair date.

7. The verification system of claim 5, wherein the registered identification data and installed identification data for the software includes data selected from the group of globally unique identifiers, version information, licensing information, an installation date, a patch date, a repair date, signature data, hash data, and authentication data.

8. The verification system of claim 1, wherein the operational component registry is resident on a central gaming system to which the gaming units are associated.

9. The verification system of claim 1, wherein the operational component registry is resident on a wide area gaming system to which the gaming units are associated.

10. The verification system of claim 1, wherein the operational component registry is resident on a local area gaming system to which the gaming units are associated.

11. The verification system of claim 1, wherein the operational component registry is resident on a gaming unit.

12. The verification system of claim 1, wherein the operational component registry is utilized in conjunction with additional operational component registries within a system of gaming units.

13. The verification system of claim 1, wherein the operational component registry is remote from the gaming units.

14. The verification system of claim 1, further comprising a update process, wherein the update process includes identification data regarding authorized changes and updates to the components of the gaming units, and wherein the update process is used to amend the operational component registry to include registered identification data for authorized changes and updates to installed components.

15. The verification system of claim 14, wherein the operational component registry is amended at predetermined intervals to include registered identification data for authorized changes and updates to components contained in the update process.

16. The verification system of claim 14, wherein the operational component registry is amended in response to a request to include registered identification data for authorized changes and updates to components contained in the update process.

17. The verification system of claim 1, further comprising a service log, wherein the service log includes information regarding diagnostic and maintenance services performed on components of the gaming units.

18. The verification system of claim 1, further comprising a productivity log, wherein the productivity log includes information regarding productivity of the gaming units.

19. The verification system of claim 1, further comprising a requirements log, wherein the requirements log includes data used to verify whether enablement of a particular component is required for proper operation of the gaming units.

20. The verification system of claim 1, wherein communication of the installed identification data from the gaming units to the operational component registry occurs at predetermined intervals.

21. The verification system of claim 1, wherein communication of the installed identification data from the gaming units to the operational component registry occurs in response to a request.

22. The verification system of claim 1, further comprising at least one user access port, wherein the access port is configured to provide access to the operational component registry.

23. The verification system of claim 1, wherein the processor examines the registered identification data and the installed identification data, determines whether the registered identification data corresponds with the installed identification data, and identifies corresponding and non-corresponding identification data for each component of the gaming units.

24. The verification system of claim 23, wherein an update process is used to update the registered identification data with authorized changes and updates to the components in response to a determination that the registered identification data and the installed identification data do not correspond to each other.

25. The verification system of claim 23, wherein gaming units having components with non-corresponding identification data are not enabled.

26. The verification system of claim 23, wherein gaming units having corresponding identification data for all components are enabled.

27. The verification system of claim 25, wherein the non-enablement of one or more non-corresponding components of a gaming unit initiates a determination of whether enablement of the gaming unit is prevented.

28. The verification system of claim 23, wherein enablement of a gaming unit is permitted regardless of whether any components having non-corresponding identification data are identified in the gaming unit.

29. The verification system of claim 25, further comprising an enablement log, wherein the enablement log includes data regarding enablement or non-enablement of the gaming units and of individual components of the gaming units.

30. The verification system of claim 1, wherein one or more gaming machine system components are assigned identification codes and are grouped together into a protected group of component bindings using cryptographic security procedures and the identification codes of the components in the bindings group, and wherein the bindings prevent falsification or repudiation of log entries with respect to any modifications or replacements of components within the bindings group.

31. A verification system in a gaming environment comprising:
 a memory device that stores a catalog of registered identification data, wherein the registered identification data comprises identification data for components supposed to be installed on multiple gaming units; and
 the memory device stores a catalog of installed identification data, wherein the installed identification data comprises identification data for multiple components that are actually installed on the gaming units, and each gaming unit includes multiple components with identification data;
 wherein the components include hardware and software.

32. The verification system of claim 31, wherein at least one of the registered identification data and the installed identification data is authenticatible and non-repudiatible.

33. The verification system of claim 31, further comprising a processor that analyzes the registered identification data and the installed identification data.

34. The verification system of claim 31 further comprising an interface between the operational component registry and the gaming units.

35. The verification system of claim 34, wherein the interface is a network interface connecting the operational component registry with remote gaming units.

36. The verification system of claim 31, wherein installed identification data is communicated to the operational component registry at predetermined intervals.

37. The verification system of claim 31, wherein installed identification data is communicated to the operational component registry in response to a triggering event.

38. The verification system of claim 31, wherein enablement of the gaming units is determined by examining the registered identification data and the installed identification data.

39. The verification system of claim 31, wherein enablement of individual components on the gaming units is determined by examining the registered identification data and the installed identification data.

40. The verification system of claim 39, wherein the registered identification data and the installed identification data each comprise unique identifiers for each component that is supposed to be installed or that is actually installed on the gaming units.

41. The verification system of claim 40, wherein the registered identification data and the installed identification data are provided for each component, the components including hardware and software;
wherein the identification data for the hardware includes at least one of serial numbers, model numbers, part numbers, a manufacture date, location information, an installation date, or repair date; and
wherein the identification data for the software includes at least one of globally unique identifiers, version information, licensing information, an installation date, a patch date, a repair date, signature data, hash data, and authentication data.

42. The verification system of claim 31, wherein the operational component registry is resident on a central gaming system.

43. The verification system of claim 31, wherein the operational component registry is resident on a wide area gaming system.

44. The verification system of claim 31, wherein the operational component registry is resident on a local area gaming system.

45. The verification system of claim 31, wherein the operational component registry is resident on a gaming unit.

46. The verification system of claim 31, wherein the operational component registry is utilized in conjunction with additional operational component registries within a system of gaming units.

47. The verification system of claim 31, further comprising an update process, wherein the update process includes identification data regarding authorized changes and updates to components listed therein.

48. The verification system of claim 47, wherein the registered identification data is amended with the update process, and the amended registered identification data reflects authorized changes and updates to registered components.

49. This verification system of claim 48, wherein amendment of the registered identification data occurs at predetermined intervals.

50. The verification system of claim 48, wherein the amendment of the registered identification data occurs in response to a triggering event.

51. The verification system of claim 31, further comprising a service log, wherein the service log includes data regarding diagnostic and maintenance services performed on components.

52. The verification system of claim 51, wherein data on the service log includes installed identification data for installed components, and the installed identification data is communicated to the change log.

53. The verification system of claim 31, further comprising a productivity log, the productivity log including productivity data for the gaming units, wherein the productivity data is searchable, manipulable, and used to generate gaming unit productivity reports.

54. The verification system of claim 31, further comprising a requirements log, the requirements log including requirements data for the gaming units.

55. The verification system of claim 54, wherein the requirements data is used to determine whether enablement of a gaming unit is predicated on enablement of the components in the gaming unit.

56. The verification system of claim 54, wherein the requirements data is used to determine whether enablement of the components is required for proper operation of the gaming units.

57. The verification system of claim 31, wherein the registered identification data and the installed identification data are examined, and corresponding identification data and non-corresponding identification data are identified for each component of the gaming units.

58. The verification system of claim 57, wherein an update process is used to update the registered identification data if non-corresponding identification data is identified for components of the gaming units, and wherein the updated registered identification data and the installed identification data are then re-examined.

59. The verification system of claim 57, wherein gaming units having components with non-corresponding identification data are not enabled, and gaming units having all components with corresponding identification data are enabled.

60. The verification system of claim 57, wherein the non-enablement of one or more non-corresponding components of a gaming unit initiates a determination of whether enablement of the gaming unit is prevented.

61. The verification system of claim 57, wherein enablement of a gaming unit is permitted regardless of whether any components having non-corresponding identification data are identified in the gaming unit.

62. The verification system of claim 31, further comprising an enablement log, the enablement log including data regarding enablement or non-enablement of gaming units, and the enablement log including data regarding enablement or non-enablement of individual components of the gaming units.

63. The verification system of claim 57, wherein components with non-corresponding identification data are not enabled, and a requirements log is used to determine whether gaming units including the non-enabled components may be enabled.

64. A method for verifying multiple components of multiple gaming units using an operational component registry in a gaming environment, the method comprising:
selecting gaming units for verification;
establishing communication with the selected gaming units;
receiving installed identification data at the operational component registry from the selected gaming units as to components actually installed on the selected gaming units, wherein each component includes hardware and software, and each gaming unit includes multiple components with identification data; and examining the installed identification data and registered identification data stored to determine enablement of the gaming units, wherein the registered identification data includes identification data for components supposed to be installed on the selected gaming units.

65. The method of claim 64, wherein the selected gaming units are remote from the operational component registry.

66. The method of claim 64, wherein the operational component registry is resident on a central gaming system to which at least one of the selected gaming units is connected.

67. The method of claim 64, wherein the operational component registry is resident on a wide area gaming system to which at least one of the selected gaming units is connected.

68. The method of claim 64, wherein the operational component registry is resident on a local area gaming system to which at least one of the selected gaming units is connected.

69. The method of claim 64, wherein the operational component registry is resident on at least one of the selected gaming units.

70. The method of claim 64, wherein the operational component registry is utilized in conjunction with additional operational component registries within a system of gaming units.

71. The method of claim 64, wherein the operational component registry and the selected gaming units communicate via an interface.

72. The method of claim 71, wherein the interface comprises a network interface.

73. The method of claim 64, wherein the installed identification data is communicated to the operational component registry at predetermined intervals.

74. The method of claim 64, wherein the installed identification data is communicated to the operational component registry in response to a request.

75. The method of claim 64, wherein the installed identification data is communicated to the operational component registry in response to a triggering event.

76. The method of claim 64, wherein examination of the installed identification data and the registered identification data is performed by a processor that is associated with the operational component registry.

77. The method of claim 76, wherein at least one of the registered identification data and the installed identification data are authenticatible and non-repudiatible.

78. The method of claim 64, wherein examination of the installed identification data and the registered identification data includes determining whether the registered identification data corresponds to the installed identification data.

79. The method of claim 78, further comprising:
determining corresponding and non-corresponding identification data for each component of the gaming units.

80. The method of claim 78, wherein the operational component registry further comprises an update process, wherein the update process is used to update the registered identification data with authorized changes to the registered components on the gaming units; and wherein the updated registered identification data and the installed identification data are then examined.

81. The method of claim 79, wherein gaming units having components with non-corresponding identification data are not enabled, and gaming units having corresponding identification data for all components are enabled.

82. The method of claim 81, wherein enablement of a gaming unit is permitted regardless of whether any components having non-corresponding identification data are identified in the gaming unit, and regardless of whether any components having non-corresponding identification data are non-enabled in the gaming unit.

83. The method of claim 64, further comprising an enablement log, wherein the enablement log includes data regarding the enablement or non-enablement of the gaming units and of individual components of the gaming units.

84. The method of claim 81, further comprising a requirements log, wherein the requirements log is used to determine whether to enable gaming units that include non-enabled components.

85. The method of claim 64, further comprising a service log, wherein the service log includes service data regarding diagnostic and maintenance services performed on components of the gaming units, and wherein the service data is communicated from the gaming units to the operational component registry.

86. The method of claim 85, wherein the service log includes installed identification data for installed components, and wherein the installed identification data is communicated from the gaming units to a service log on the operational component registry.

87. The method of claim 64, further comprising a productivity log, wherein the productivity log includes productivity data for the gaming units, and wherein the productivity data is communicated from the gaming units to the operational component registry.

88. A method for verifying and selectively enabling gaming units, the method comprising:
receiving installed identification data from multiple gaming units at an operational component registry through an interface located on the operational component registry, wherein the operational component registry includes registered identification data for components supposed to be installed on the gaming units and installed identification data for multiple components that are actually installed on the multiple gaming units, and the components include hardware and software, and each gaming unit includes multiple components with identification data;

storing registered identification data on a memory device located within the operational component registry; and examining the registered identification data and the installed identification data using a processor located in the operational component registry to determine enablement of the gaming units.

89. The method of claim 88, wherein the registered identification data includes identification data for components that are supposed to be installed on the gaming units, and wherein the installed identification data includes identification data for components that are actually installed on the gaming units.

90. The method of claim 89, wherein the installed identification data is communicated from the gaming units to the operational component registry via the interface.

91. The method of claim 88, wherein the interface between the operational component registry and the gaming units is a network interface.

92. The method of claim 88, wherein the registered identification data and the installed identification data for the hardware include at least one of serial numbers, model numbers, part numbers, a manufacture date, location information, an installation date or a repair date; and wherein the registered identification data and the installed identification data for the software include at least one of globally unique identifiers, version information, licensing information, an installation date, patch date, a repair date, signature data, hash data, and authentication data.

93. The method of claim 88, wherein one or more operational component registries are resident on at least one of a central gaming system, wide area gaming system, and local area gaming system.

94. The method of claim 88, wherein an operational component registry is utilized in conjunction with additional operational component registries on at least one or more gaming units.

95. The method of claim 88, wherein the memory device that stores the registered identification data is remote from the operational component registry.

96. The method of claim 88, further comprising:
determining whether the registered identification data corresponding the installed identification data.

97. The method of claim 88, further comprising:
determining corresponding and non-corresponding identification data for each component of the gaming units.

98. The method of claim 96, further comprising providing an update process, wherein the update process includes data regarding authorized changes and updates to the components, wherein data from the update process is used to update the registered identification data, and wherein the updated registered identification data and the installed identification data are then re-examined.

99. The method of claim 98, wherein the registered identification data is updated with the update process data at predetermined intervals.

100. The method of claim 98, wherein the registered identification data is updated with the update process data in response to a request.

101. The method of claim 98, wherein the registered identification data is updated with the update process data in response to a triggering event.

102. The method of claim 98, wherein the registered identification data is updated with the update process data at least once following the determination of non-corresponding identification data for components of the gaming units.

103. The method of claim 96, further comprising:
determining whether to enable the gaming units, wherein the corresponding and non-corresponding identification data for the components of the gaming units are used to determine whether to enable gaming units, wherein gaming units having components with non-corresponding identification data are not enabled, and wherein gaming units having components with all corresponding identification data are enabled.

104. The method of claim 96, further comprising:
selecting individual gaming units for enablement, wherein the gaming units have corresponding identification data.

105. The method of claim 96, further comprising:
selecting individual components of the gaming units for enablement, wherein the components have corresponding identification data.

106. The method of claim 96, further comprising:
determining whether to permit enablement of gaming units including one or more components that have non-corresponding identification data and are not enabled.

107. The method of claim 106, wherein enablement of a gaming unit is permitted regardless of whether any components having non-corresponding identification data are identified in the gaming unit.

108. The method of claim 96, further comprising an enablement log, wherein the enablement log includes data regarding enablement or non-enablement of the gaming units and of individual components of the gaming units.

109. The method of claim 96, further comprising a requirements log, wherein the requirements log includes data used to verify whether enablement of non-enabled components is required for proper operation of gaming units, and wherein the requirements log is used to prevent enablement of the gaming units if a non-enabled component is required.

110. The method of claim 96, further comprising:
assigning identification codes to gaming machine system components within a gaming unit;
binding together one or more gaming machine system components within the gaming unit, including registered identification data and installed identification data, into a protected group of component bindings using cryptographic security procedures and the identification codes of the components in the bindings group, and wherein the bindings prevent falsification or repudiation of log entries with respect to any modifications or replacements of components within the binding group.

111. A verification system utilizing an operational component registry, the verification system comprising:
a memory device, wherein the memory device stores registered identification data for multiple components supposed to be installed on multiple gaming units, and wherein the components include hardware and software, and each gaming unit includes multiple components with identification data;
an interface that communicates installed identification data from the gaming units to the operational component registry, wherein the installed identification data includes identification data for multiple components actually installed on the gaming units; and
a processor that analyzes the registered identification data and the installed identification data of the components installed on the gaming units; and wherein enablement of the gaming units is determined by examining the registered identification data and the installed identification data; and
wherein gaming machine system components are assigned identification codes and are grouped together into a protected group of component bindings using cryptographic security procedures and the identification codes of the components in the bindings group, and wherein the bindings prevent falsification or repudiation of log entries with respect to any modifications or replacements of components within the bindings group.

112. A verification system utilizing an operational component registry, the verification system comprising:
a memory device that stores a catalog of registered identification data, wherein the registered identification data comprises identification data for multiple components supposed to be installed on multiple gaming units, and wherein the components include hardware and software, and each gaming unit includes multiple components with identification data; and
the memory device stores a catalog of installed identification data, wherein the installed identification data comprises identification data for components that are actually installed on the gaming units; and
wherein gaming machine system components, including at least one of the catalogs, are assigned identification codes and are grouped together into a protected group of component bindings using cryptographic security procedures and the identification codes of the components in the bindings group, and wherein the bindings prevent falsification or repudiation of log entries with respect to any modifications or replacements of components within the binding group.

113. A method for verifying components of gaming units using an operational component registry, the method comprising:

assigning identification codes to multiple gaming machine system components within multiple gaming units, wherein the components include hardware and software, and each gaming unit includes multiple components with identification codes;

binding together gaming machine system components within the gaming unit, including registered identification data and installed identification data, into a protected group of component bindings using cryptographic security procedures and the identification codes of the components in the bindings group, and wherein the bindings prevent falsification or repudiation of log entries with respect to any modifications or replacements of components within the binding group;

selecting gaming units for verification;

establishing communication with the selected gaming units;

receiving installed identification data at the operational component registry from the selected gaming units as to components actually installed on the selected gaming units; and examining the installed identification data and registered identification data to determine enablement of the gaming units, wherein the registered identification includes identification data for components supposed to be installed on the gaming units.

114. A method for verifying and selectively enabling gaming units, the method comprising:

assigning identification codes to multiple gaming machine system components within multiple gaming units, wherein the components include hardware and software, and each gaming unit includes multiple components with identification codes;

binding together gaming machine system components within the gaming unit, including registered identification data and installed identification data, into a protected group of component bindings using cryptographic security procedures and the identification codes of the components in the bindings group, and wherein the bindings prevent falsification or repudiation of log entries with respect to any modifications or replacements of components within the binding group;

receiving installed identification data from gaming units at an operational component registry through an interface located on the operational component registry, wherein the installed identification data includes identification data for components that are actually installed on the gaming units;

storing registered identification data on a memory device located within the operational component registry, wherein the registered identification data includes identification data for components that are supposed to be installed on the gaming units; and examining the registered identification data and the installed identification data using a processor located in the operational component registry to determine enablement of the gaming units.

* * * * *